United States Patent
Huang et al.

(10) Patent No.: US 7,884,467 B2
(45) Date of Patent: Feb. 8, 2011

(54) PACKAGE STRUCTURE OF A MICROPHONE

(75) Inventors: Chin-Ching Huang, Taichung (TW); Jiung-Yue Tien, Taichung (TW); Hsi-Chen Yang, Houli Township, Taichung County (TW)

(73) Assignee: Lingsen Precision Industries, Ltd., T.E.P.Z. (TW)

( * ) Notice: Subject to any disclaimer, the term of this patent is extended or adjusted under 35 U.S.C. 154(b) by 405 days.

(21) Appl. No.: 12/219,276

(22) Filed: Jul. 18, 2008

(65) Prior Publication Data

US 2008/0285784 A1  Nov. 20, 2008

Related U.S. Application Data

(62) Division of application No. 11/391,607, filed on Mar. 29, 2006, now abandoned.

(30) Foreign Application Priority Data

Jan. 24, 2006 (TW) ............... 95102675 A

(51) Int. Cl.
*H01L 23/12* (2006.01)

(52) U.S. Cl. ............ 257/704; 257/710; 257/924; 257/E23.18; 257/E23.181; 381/361

(58) Field of Classification Search .......... 257/678, 257/704, 710, 924, E23.128, E23.18–E23.193, 257/E21.5, E21.501; 381/361
See application file for complete search history.

(56) References Cited

U.S. PATENT DOCUMENTS 7,061,099 B2 * 6/2006 Lu et al. ............. 257/704
7,193,315 B2 * 3/2007 Jang et al. ............. 257/704

FOREIGN PATENT DOCUMENTS

| JP | 63-227198 A | 9/1988 |
| JP | 05-273983 A | 10/1993 |
| JP | 06-232628 A | 8/1994 |
| JP | 07-283853 A | 10/1995 |
| JP | 09-215080 A | 8/1997 |
| JP | 2001-007588 A | 1/2001 |
| JP | 2001-238291 A | 8/2001 |
| JP | 2001-326997 A | 11/2001 |

* cited by examiner

*Primary Examiner*—Jasmine J Clark
(74) *Attorney, Agent, or Firm*—Rosenberg, Klein & Lee

(57) ABSTRACT

A kind of microphone package structure includes at least of a substrate, a sound processing unit, an upper cap and other devices. There would be at least one trench set on the substrate, and a separation gap between the trench and the bonding pad of the substrate is maintained. After connective paste is smeared on the surface of the substrate, the trench would be assembled with other devices. This kind of package structure could prevent a short circuit being caused by the overflowing of the connective paste.

14 Claims, 9 Drawing Sheets

PACKAGE STRUCTURE OF A MICROPHONE

CROSS-REFERENCE TO RELATED APPLICATIONS

This application is a divisional of U.S. patent application Ser. No. 11/391,607, filed Mar. 29, 2006 now abandoned, and the entire contents of which are incorporated herein by reference.

BACKGROUND

1. Field of Invention

The present invention relates generally to the package structure of microphone, and more particularly to the package structure of microphone with avoiding the short circuit caused by the overflowing of the conductive paste.

2. Description of Related Art

Modern electromagnetic communication is frequently facilitated by hand held and home based wireless communication devices. Nowadays, dense signal transmissions in mobile telephones cause serious interference in the amplifier circuit of the microphone. This phenomenon usually happens between popular mobile telephones and the microphones.

Reference is made to FIG. 1, which illustrates a stereo assembly drawing of a related microphone package structure. The package structure comprises the body 100, the substrate 110, sound processing unit 120, bonding pad 130, conductive line 140 and the upper cap 160.

The substrate 110 includes the circuit board and the sound processing unit 120 is set on the circuit board with the conductive line 140 and the bonding pad 130. The substrate connection 111 is also prepared to connect to the connection 161 on the upper cap 160, and the acoustic hole 162 is on the upper cap 160.

Reference is made to FIG. 1 and FIG. 2, which illustrate profiles of the package structure of the microphone. The bonding pad 130 is on the same plate as the substrate connection 111, moreover, these bonding pads 130 are separated by a short distance. After smearing the conductive paste 150 on the substrate connection 111, the upper cap 160 can be attached to the body 100. The conductive paste 150 may make two bonding pads 130 conductive when the upper cap 160 presses the conductive paste 150. This unnecessary short circuit would disable the sound processing unit 120. (In order to illustrate the relative position between the conductive paste 150 and the upper cap 160, there are only two sides of the conductive paste 150 except for the front part, and so are the other profiles.)

A good connection cannot be established between the body 100 and the upper cap 160. If this package structure were hit by a foreign force, the middle of the body 100 and upper cap 160 would slide so that the appearance and the reliability of the package structure would be diminished.

The problems as mentioned about the known technology could disable the sound gathering and processing functions; therefore, the reliability and quality of the microphone would be diminished and the maintenance cost of the microphone would increase, but all these problems can be improved by the present invention.

SUMMARY

In order to not only solve the aforementioned and other problems, but also achieve the technical benefits which this invention advocates, the present invention provides a microphone package structure that prevents the short circuit caused by the conductive paste overflow.

It is the objective of the present invention to provide a microphone package structure which forms at least one trench in the connection between the substrate and the upper cap, and a gap between this trench and the bonding pad is maintained.

It is another objective of the present invention to provide a microphone package structure whose electromagnetic shelter is more effective. The effectiveness of the electromagnetic shelter around the sound processing unit can be improved by smearing conductive paste on the substrate trench inside the microphone.

According to the aforementioned objectives of the present invention, a microphone package structure with a trench is provided. In one embodiment of the present invention, the substrate connection is attached with one trench formed in the lower part of the upper cap downward. This trench could be a circular trench, a rectangular trench or a trench of another shape. The trench shape depends on the shape of the substrate. These trenches could also be plural trenches. For example, if the lower surface of the upper cap is divided into discrete sections, a trench could be formed in each of these discrete sections resulting in a plurality of trenches. Through this method, the connective area between the substrate and the upper cap would be increased, the connection boosted, and the pressure from upper cap caused by the conductive paste smeared on the surface of the trenches would prevent short circuits between the bonding pads of the substrate.

According to the objective of the present invention, a package structure which can increase the effectiveness of the electromagnetic shelter of the microphone is provided. In one embodiment of the present invention, it is necessary to smear a layer of conductive paste on the trench surface next to the substrate before the connection and between the substrate and upper cap, which forms the package structure of microphone. As a result, there would be a circular electromagnetic shelter effect in the sound processing unit which is set on the substrate after the connection between the substrate and upper cap.

The microphone package structure of the present invention could not only eliminate the disabilities of the electronic units using earlier technology, which commonly has conductive paste overflowing, but also provide a package structure for the electronic unit with a more effective electromagnetic shelter.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
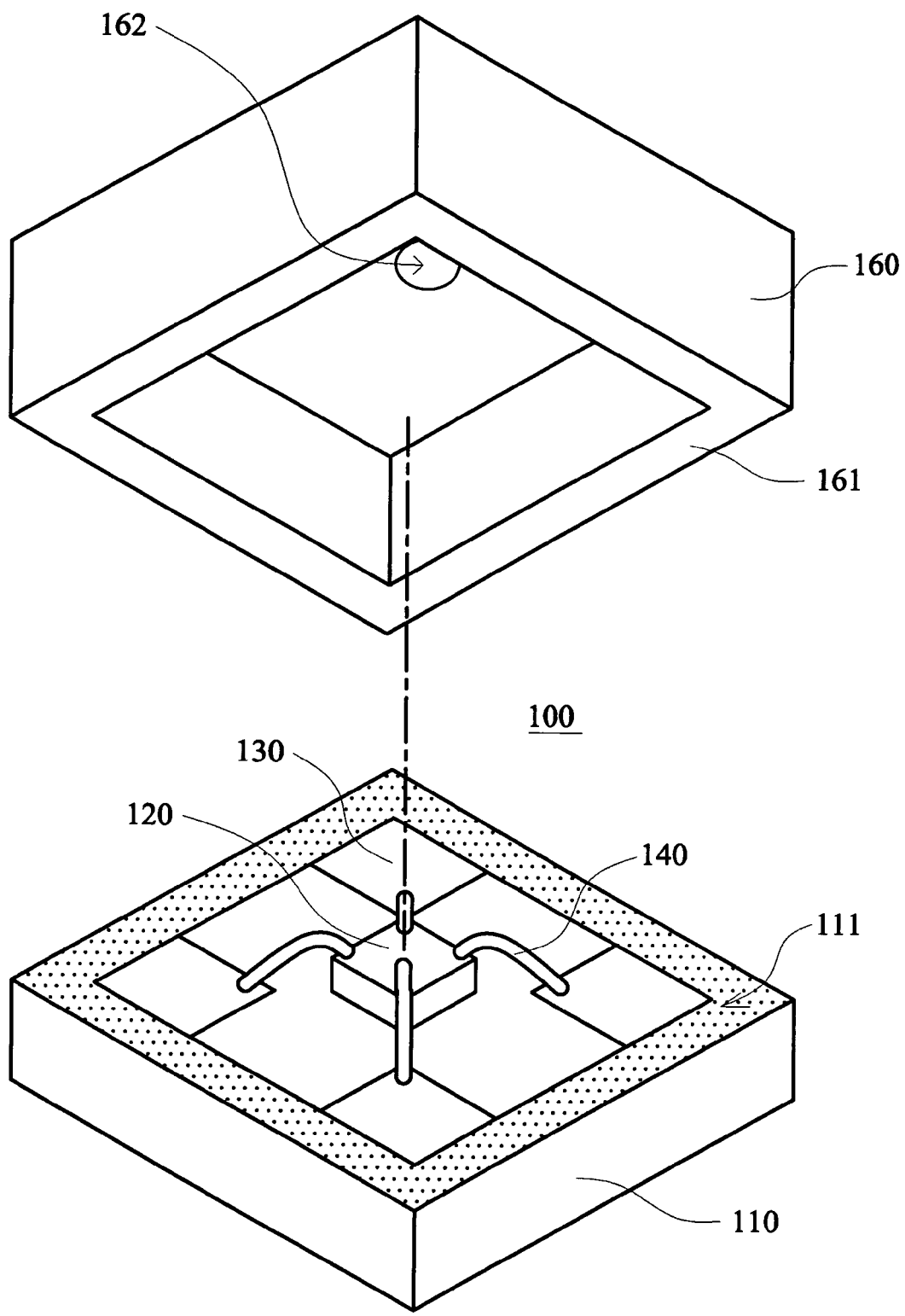
FIG. 1 illustrates a stereo assembly drawing of a related microphone package structure (the connective area of the substrate is at the same height as the bonding pad)
Figure 2:
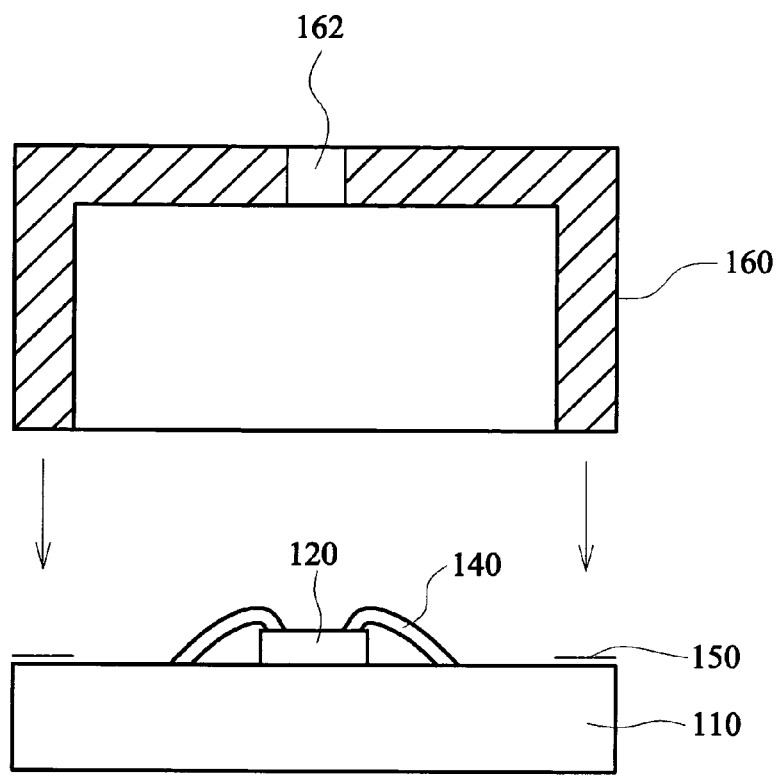
FIG. 2 illustrates a profile of the related microphone package structure (the connective area of the substrate is the same altitude as the bonding pad)

Reference will now be made in detail to the present preferred embodiments of the invention, examples of which are illustrated in the accompanying drawings. Wherever possible, the same reference numbers are used in the drawings and the description to refer to the same or like parts.

While the specification concludes with claims defining the features of the invention that are regarded as novel, it is believed that the invention will be better understood from a consideration of the following description in conjunction with the figures, in which like reference numerals are carried forward.

Figure 3:
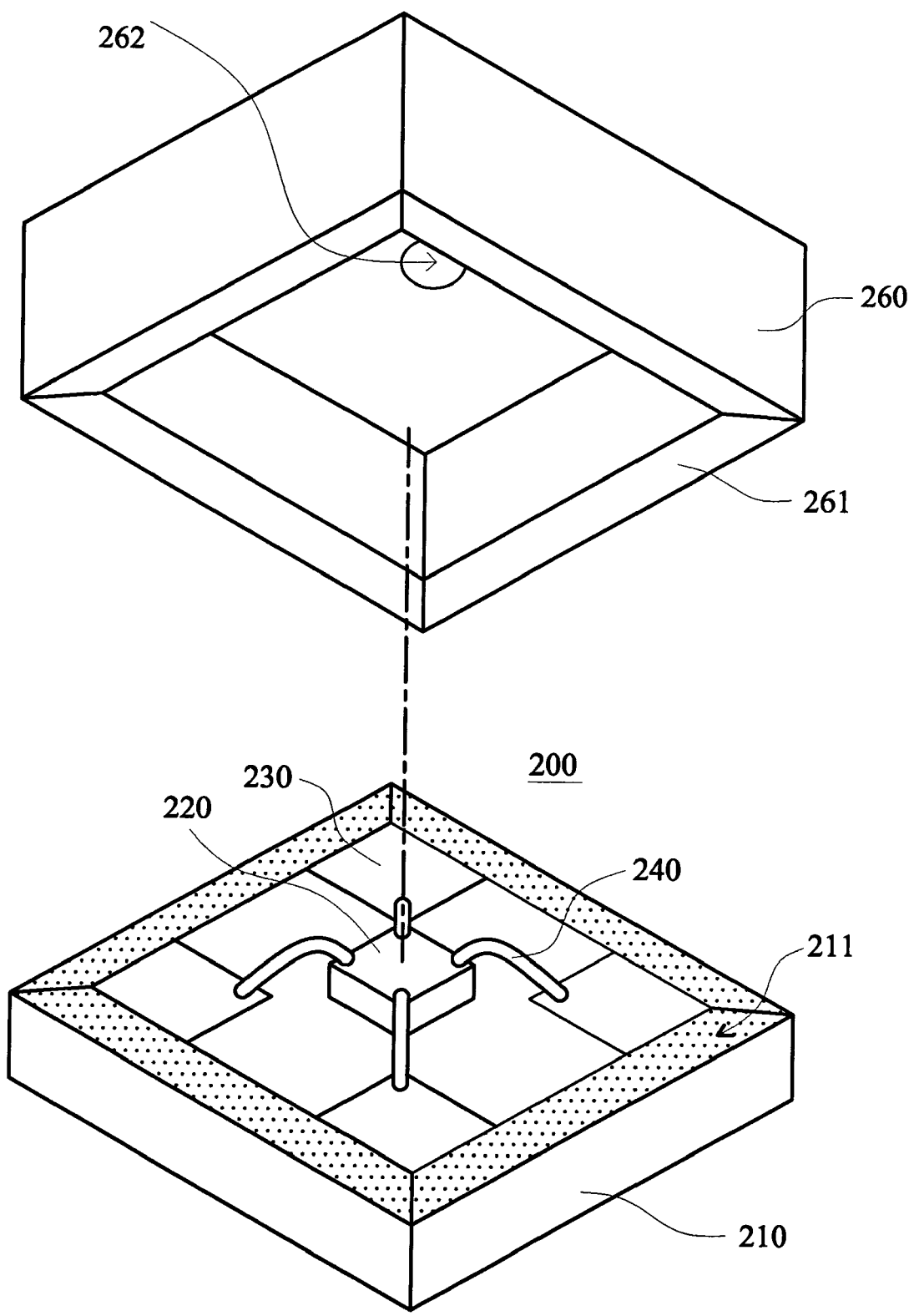
FIG. 3 illustrates a stereo assembly drawing of the microphone package structure of the preferred embodiment of the present invention (the connective area of the substrate is an outward inclined plane)

Reference is made to FIG. 3, which illustrates a stereo assembly drawing of the microphone package structure of the preferred embodiment of the present invention. A package structure comprises a main body 200, a substrate 210, a sound processing unit 220, a bonding pad 230, a wire 240, and an upper cap 260 containing an acoustic hole 262.

The connective area 211 of the substrate 210 connects with the connective area 261 of the upper cap (as the spotted area in the FIG. 3) and is constituted by an outward inclined plane. Moreover, the substrate 210 contains a circuit board with sound processing unit 220, and the necessary electronic connection would be done through the wire 240 and the bonding pad 230. The shape of the connective area 211 of the substrate could be rectangular or circular and both the connective area 211 and 261 of the upper cap are interactive inclined planes. Besides, the substrate 210 and the upper cap 260 could be rectangles or non-rectangles.

Figure 4:
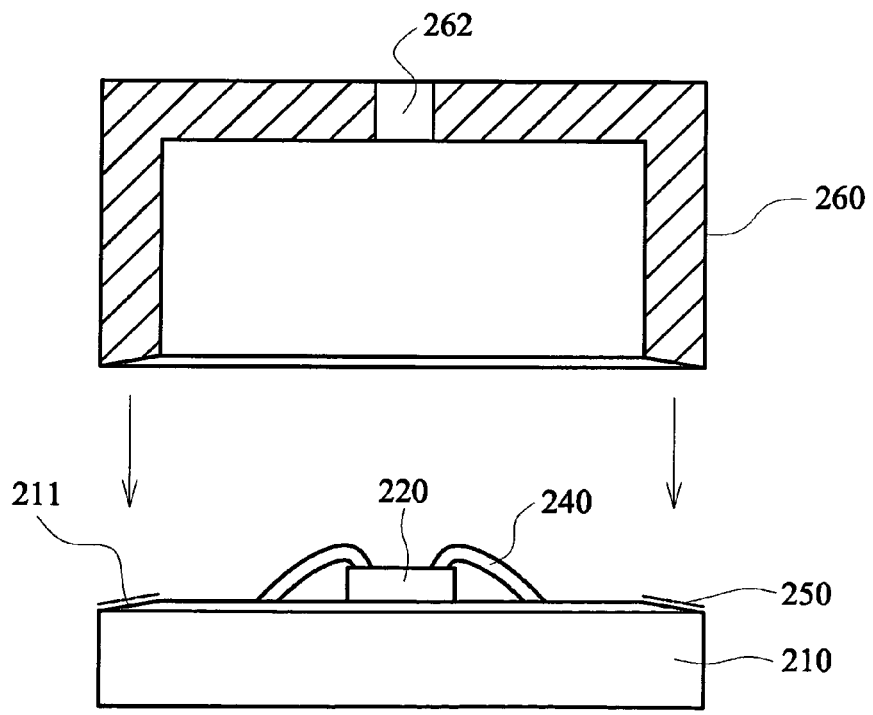
FIG. 4 illustrates a profile of a microphone package structure of the preferred embodiment of the present invention (the connective area of the substrate is an outward inclined plane)

Reference is made to FIG. 4, which illustrates a profile of the microphone package structure of the preferred embodiment of the present invention. There is an angle between the connective area 211 of the rectangular substrate and the bonding pad 230, so it is not easy for the conductive paste 250 smeared on the connective area 211 of the substrate to be pressed to the located plane of the bonding pad 230 when the connective area 211 of the substrate and the connective area 261 of the upper cap connect. Consequently, the extra conductive paste 250 would be pressed to the outside of the substrate 210.

Figure 5:
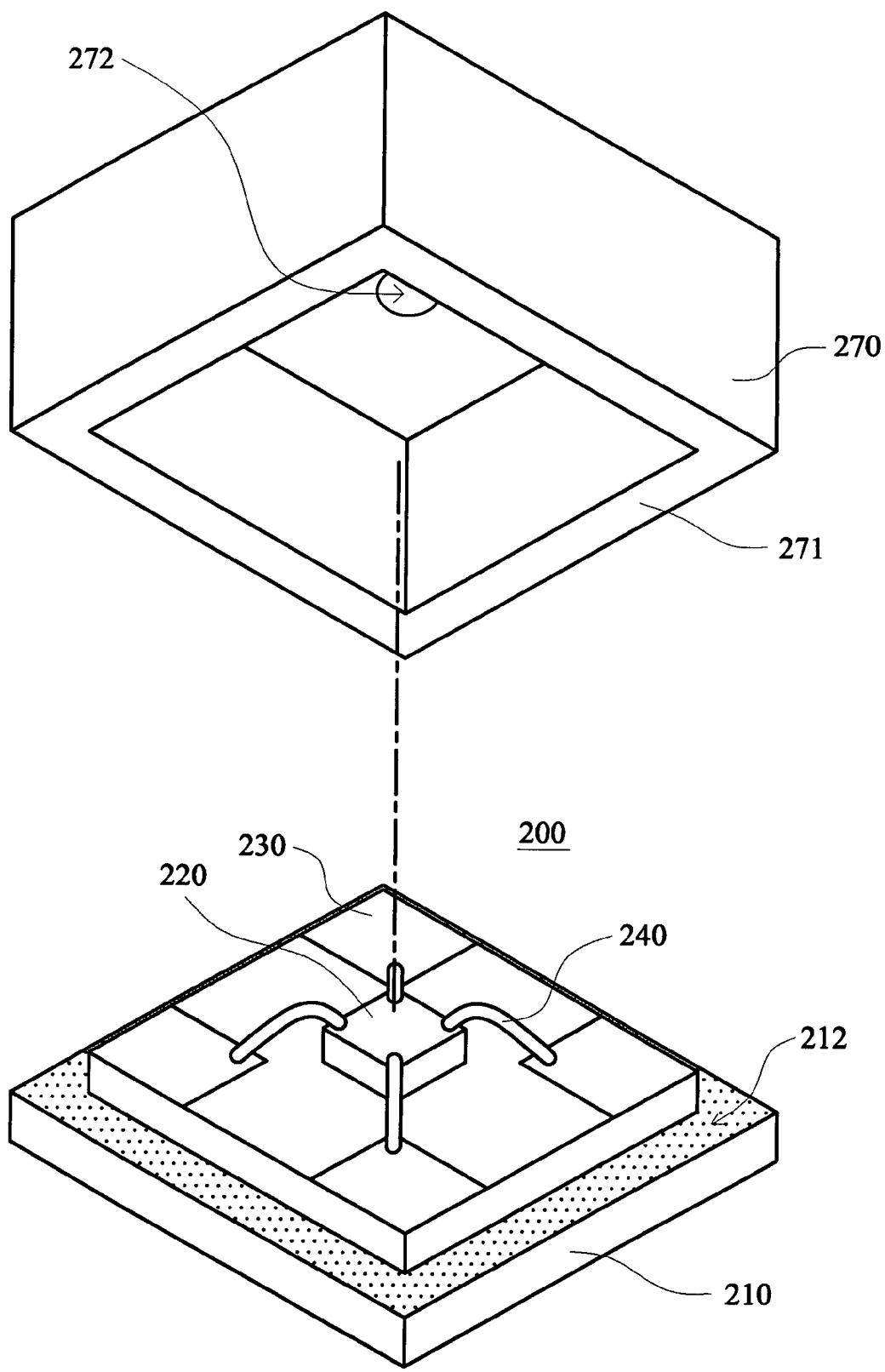
FIG. 5 illustrates a stereo assembly drawing of the microphone package structure of the preferred embodiment of the present invention (the connective area of the substrate downward forms a circular trench)

Reference is made to FIG. 5, which illustrates a stereo assembly drawing of the microphone package structure of the preferred embodiment of the present invention. The package structure comprises the main body 200, the substrate 210, the sound processing unit 220, the bonding pad 230, the wire 240, and an upper cap 270 containing an acoustic hole 272.

The connective area of the substrate 210 connects to the connective area 271 of the upper cap (as the spotted area in the FIG. 5). The upper surface of the connective area 210 of the substrate has a rectangular trench 212 formed in it. Moreover, the substrate 210 contains a circuit board with sound processing unit 220, and the necessary electronic connection would be done through the wire 240 and the bonding pad 230. The shape of the trench 212 could be rectangular or circular. Besides, the upper cap 270 could be a rectangle or some other shape.

Figure 6:
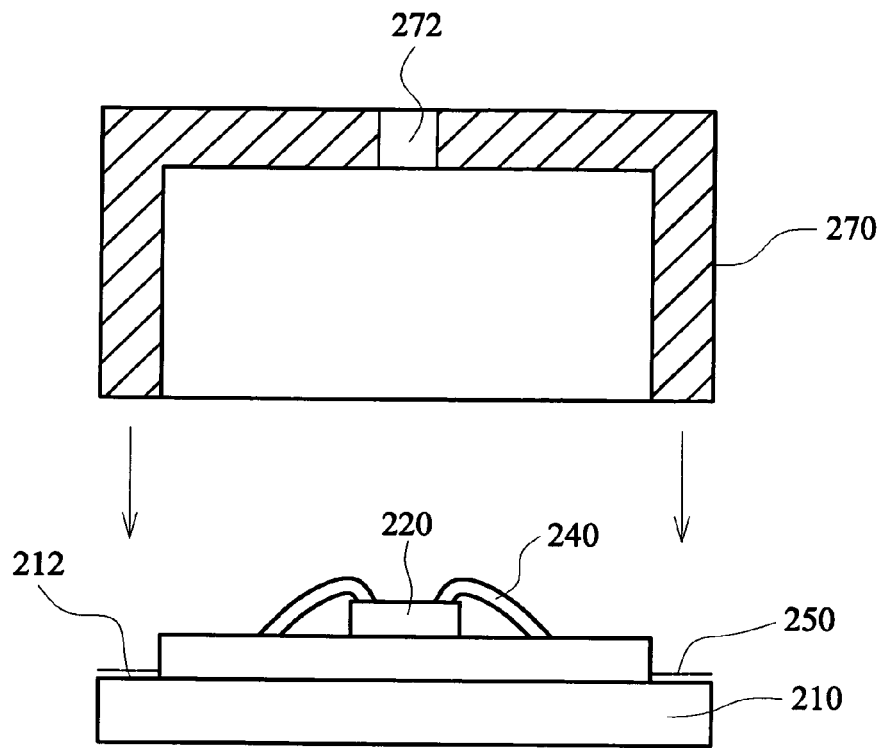
FIG. 6 illustrates a profile of the microphone package structure of the preferred embodiment of the present invention (the lower connective area of the substrate forms a circular trench)

Reference is made to FIG. 6, which illustrates a profile of the microphone package structure of the preferred embodiment of the present invention. Because of the separation height between the trench 212 and the bonding pad 230 is maintained, a bolt-connected structure would be connected between the four corners of the trench 212 and the upper cap 270 after the connection of the substrate 210 and the upper cap 270. It could provide a secure, stable connection before the conductive paste 250 completely hardens.

Figure 7:
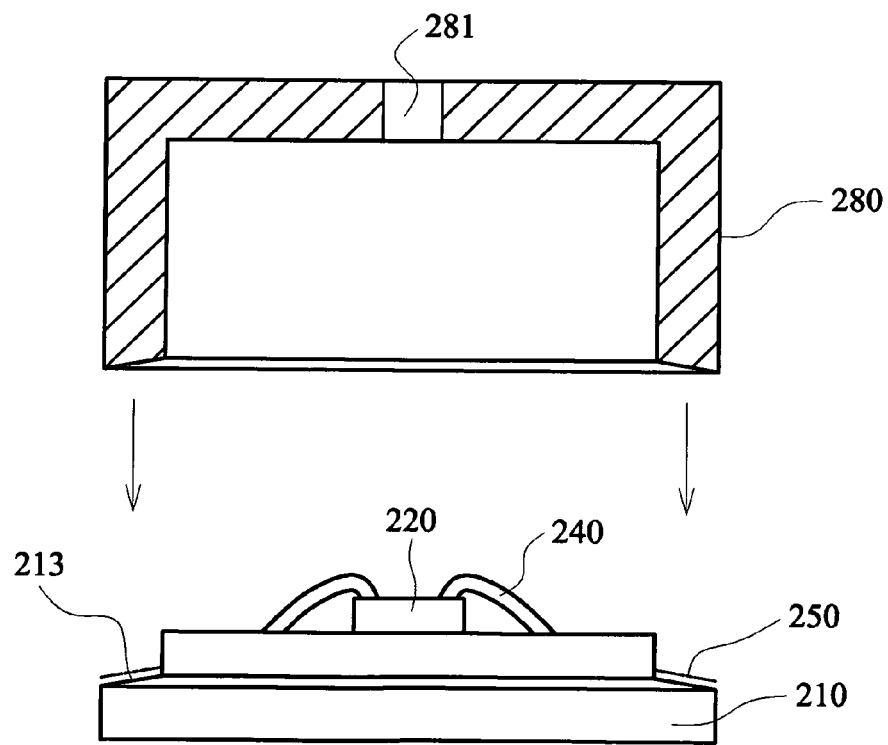
FIG. 7 illustrates a profile of the microphone package structure of the preferred embodiment of the present invention (the connective area of the lower substrate forms a circular trench, and the bottom of the trench is an outward inclined plane)

Reference is made to FIG. 7, which illustrates a profile of the microphone package structure of the preferred embodiment of the present invention. The bottom of the trench 212 in FIG. 6 would be transformed into an inclined plane outward from the substrate 210; therefore there would be a new trench 213. Besides, an upper cap 280 comprises an acoustic hole 281, and the upper cap could be a rectangle or some other shape.

The trench 213 maintains altitude fixed separation difference from the bonding pad 230, and the downward incline of the bottom could prevent short circuits caused by the conductive paste 250 which is pressed by the upper cap 280 on the bonding pad 230. Also, the extra conductive paste 250 would be pressed to the outside of the substrate 210. The shape of the trench 213 could be rectangular or circular and the trench 213 is a concave inclined plane which is connected to each other with the connective area of the upper cap 280.

Figure 8:
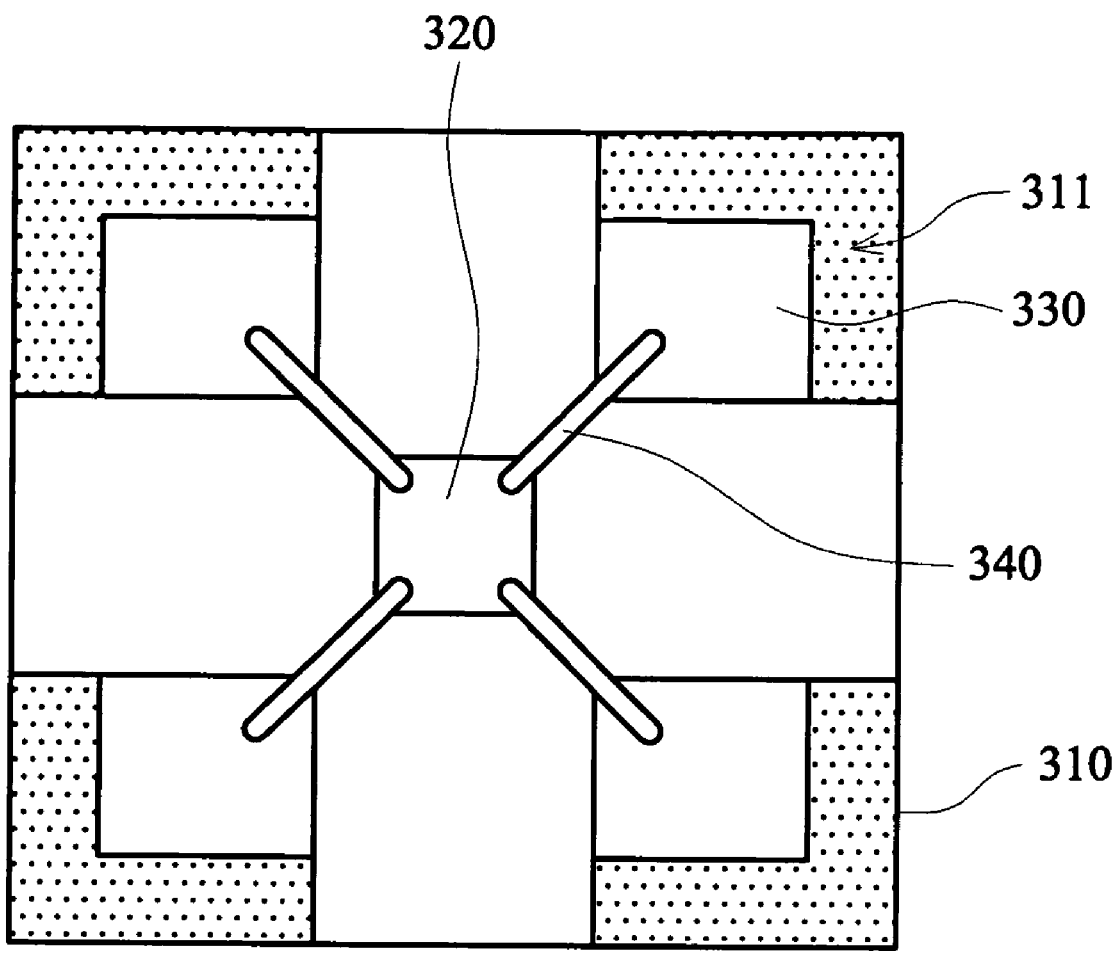
FIG. 8 illustrates a top view of the microphone package structure of the preferred embodiment of the present invention (the connective area of the lower substrate forms four L-like trenches)

Reference is made to FIG. 8, which illustrates a top view of the microphone package structure of the preferred embodiment of the present invention. A main body 300 comprises a substrate 310, a sound processing unit 320, a bonding pad 330 and a wire 340.

Four L-like trenches 311 are formed beneath the four corners of the substrate 310. Moreover, the substrate 310 contains a circuit board with sound processing unit 320, and the necessary electronic connection would be done through the wire 340 and the bonding pad 330. The trench forms an interval between the pairs and secured by a bolt structure that is more secure than the aforementioned mono-circular trench form (like the trench 212 and 213). Besides, the substrate 310 could be rectangular or non-rectangle.

Figure 9:
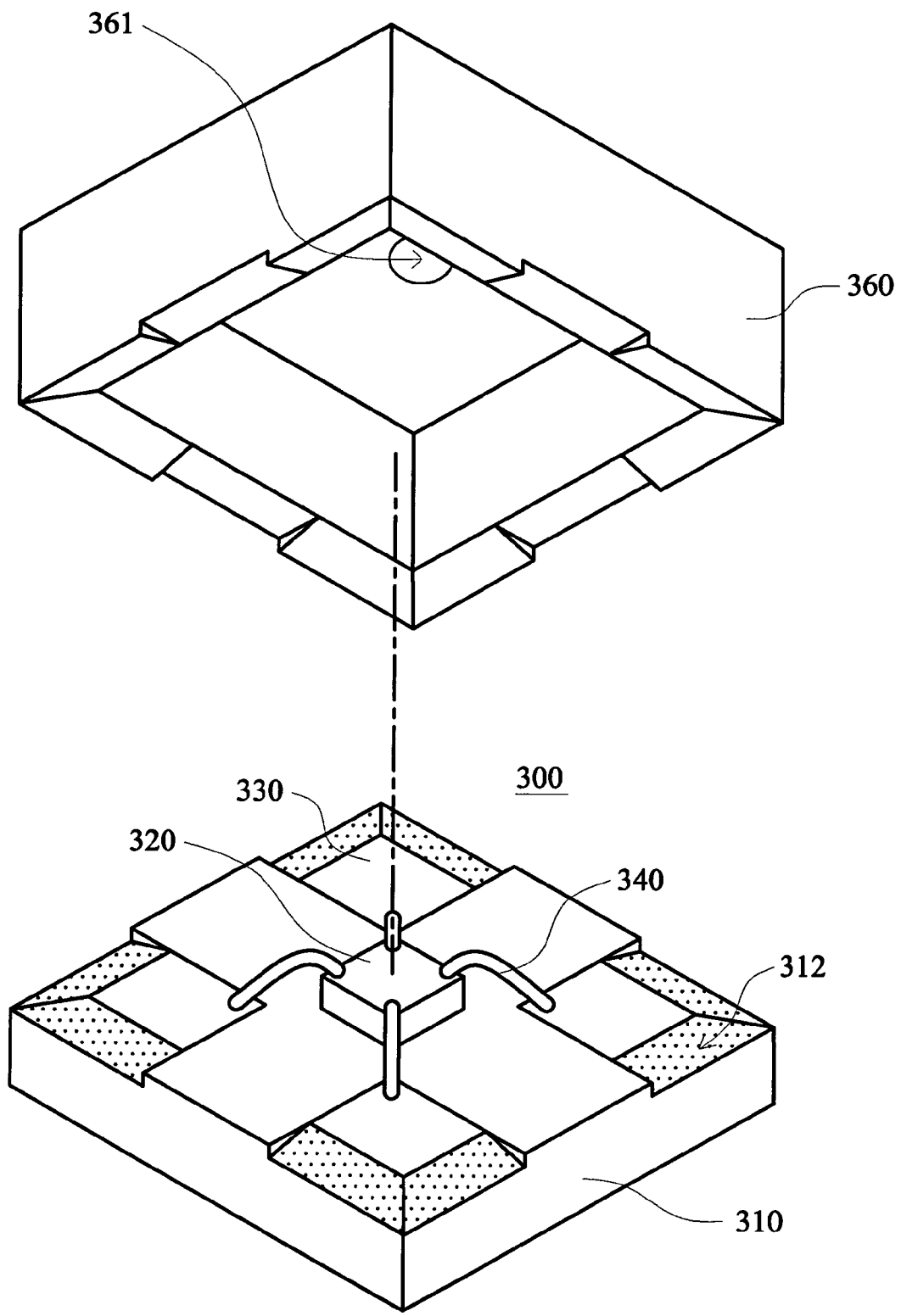
FIG. 9 illustrates a stereo assembly drawing of the microphone package structure of the preferred embodiment of the present invention (the connective area of the substrate downward forms four L-like trenches, and the bottom of the trench is an outward inclined plane)

Reference is made to FIG. 9, which illustrates a stereo assembly drawing of the microphone package structure of the preferred embodiment of the present invention. These L-like trenches 312 in the Figure are formed by inclining the connective area of the substrate surface 310 downwards, and a protrusion between the pairs of the trenches 312 exists in order to form a bolt-connective structure of rectangular serration after the connection of the upper cap 360 and the main body 310. This provides better ability to connect than the circular trench 212 in FIG. 5. Both the connective area of the trench 312 and upper cap 360 are interactive inclined planes, and the upper cap 360 includes an acoustic hole 361 that could be rectangle or non-rectangle.

Figure 10:
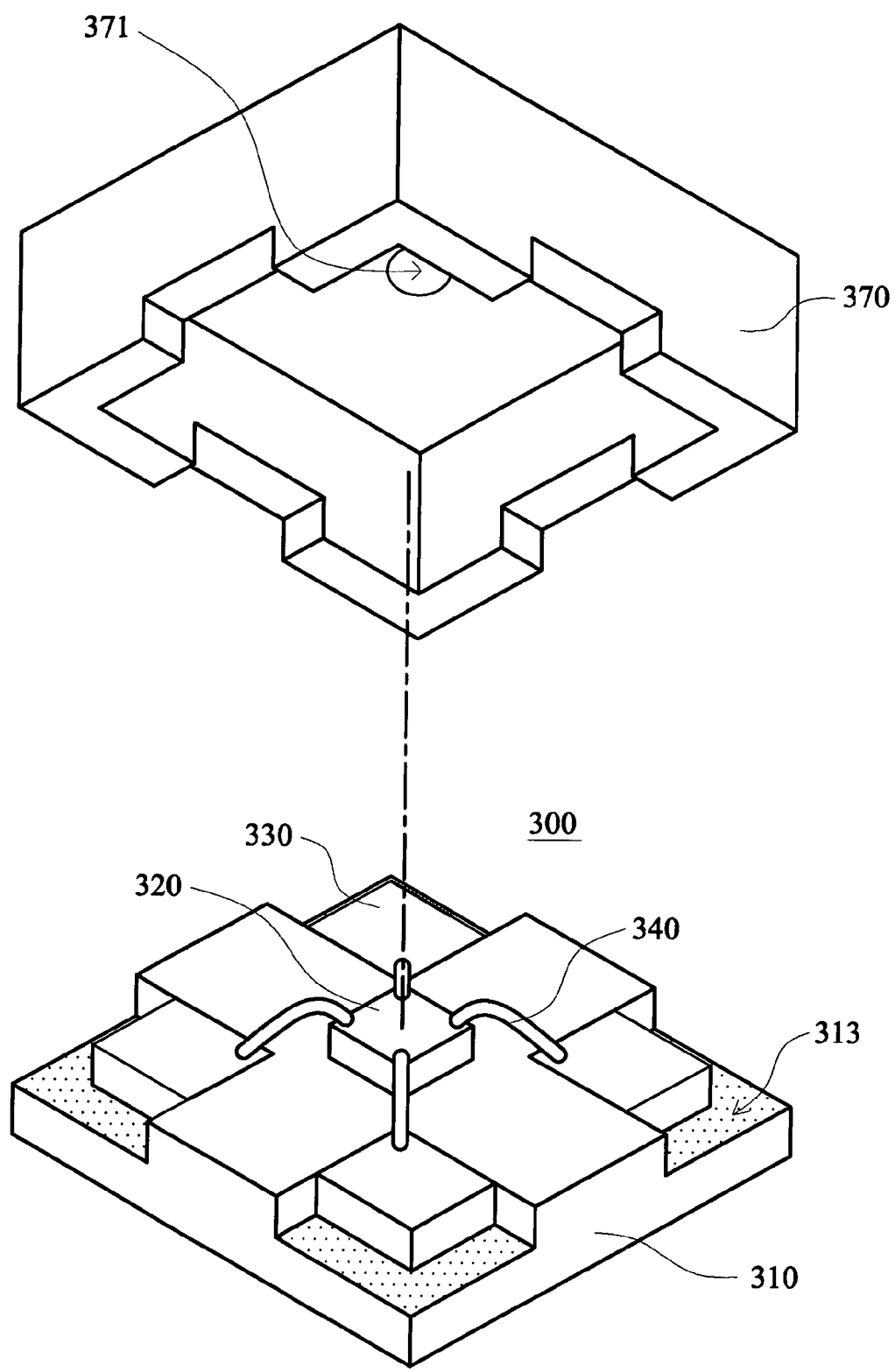
FIG. 10 illustrates a stereo assembly drawing of the microphone package structure of the preferred embodiment of the present invention (the connective area of the substrate downward forms four L-like trenches)
Figure 11:
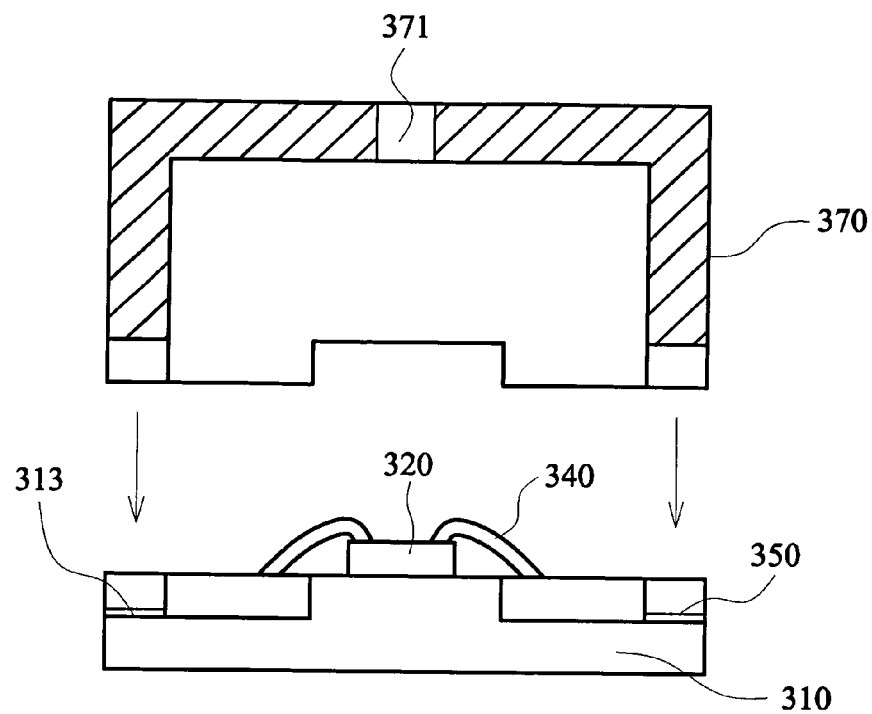
FIG. 11 illustrates a profile of the microphone package structure of the preferred embodiment of the present invention (the connective area of the lower substrate forms four L-like trenches)

Reference is made to FIGS. 10 and 11, which illustrate a stereo assembly drawing and a profile of the microphone package structure of the preferred embodiment of the present invention. As shown in the Figure, the L-like trench maintains a separation difference with the bonding pad 330. After the upper cap 370 is connected to the substrate 310 by the conductive paste 350, although the bottom of the trench 313 is flat, the separation distance between the bonding pad 330 and the trench 313 is enough to prevent the extra conductive past 350 from being pressed to the plane of the bonding pad 330, which would make an unnecessary short circuit. Therefore, the separation difference provides a stronger bolt-connective structure than the trench 312 in the FIG. 9. The upper cap 370 includes an acoustic hole 371 that could be rectangle or non-rectangle.

Figure 12:
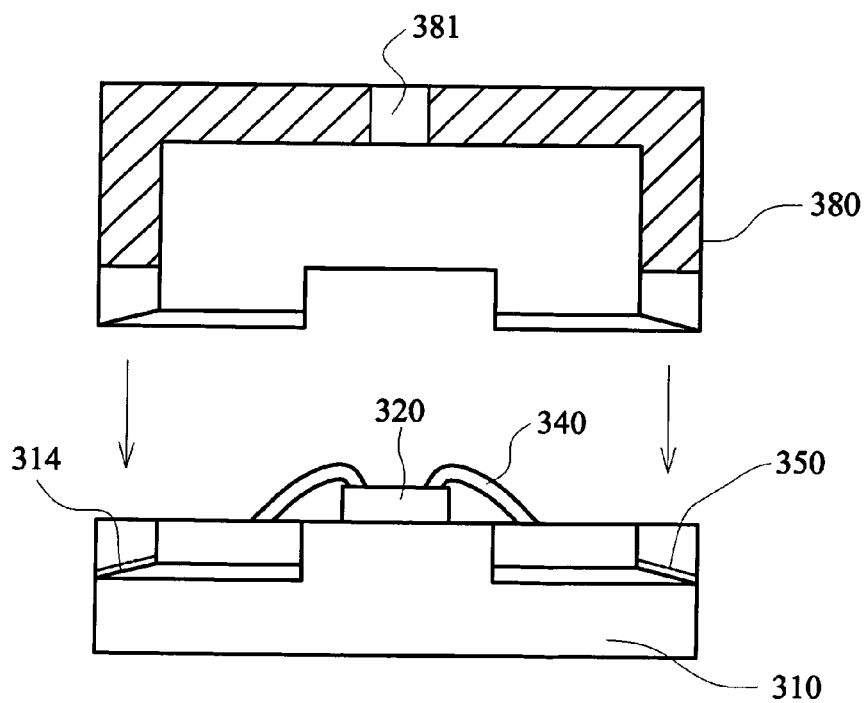
FIG. 12 illustrates a profile of the microphone package structure of the preferred embodiment of the present invention (the connective area of the substrate downward forms four L-like trenches, and the bottom of the trench is an outward inclined plane).

Reference is made to FIG. 12, which illustrates a profile of the microphone package structure of the preferred embodiment of the present invention. The trenches of the substrate 310 are four L-like trenches, and they not only are concave but also have an inclined plane that matches the connective area of the upper cap 380. The upper cap 380 including an acoustic hole 381 could be rectangle or non-rectangle.

When the upper cap 380 connects to the substrate 310, the inclined plane structure decreases the opportunity for the conductive paste 350 to be pressed by the upper cap 280 onto the sound processing unit 220 plane. Thus, extra connective paste 350 would be pressed to the outside of the package structure, making it easy to erase.

The trench 314 excludes extra connective paste 350, as the trench 312 in FIG. 9, and also allows for a stronger bolt-connected structure than the bolt-connected structure for the trench 313 in FIG. 10.

According to the composition and the embodiments above, there are many advantages of the present invention over the prior art, such as:

1. In the current invention, a gap between the substrate and the connective paste is maintained so that the connective paste smeared on the surface of the trench will not easily be pressed onto the bonding pad by the upper cap and create a short circuit between the bonding pads.

2. Around the sound processing unit is the connective area of the upper cap and the substrate in the microphone package structure, and the connective area is smeared with the connective paste. Therefore, the increased effectiveness of a circular electromagnetic shelter could be established, and it could not only raise the durability of a microphone but also decrease the maintenance cost.

3. The structures of the lower part of the upper cap and the surface of the trench are designed as a combination of the inclined and flat plane. This design prevents the connective paste from overflowing to the outside of the package structure and prevent a short circuit being caused by the overflowing of the connective paste effectively; moreover, the bolt-connected structure of the substrate and upper cap would be more stable and stronger.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A microphone package structure, comprising:
    a substrate including a plural bonding pads and a plurality of first connective areas wherein the bonding pads and the first connective areas are respectively defined on different planes, and the first connective areas are separated from each other and are smeared with conductive paste;
    a sound processing unit mounted on the substrate, and connected with the bonding pads by a plural of wires; and
    an upper cap including a plurality of second connective areas corresponding to the first connective areas of the substrate mounted on the substrate and covering the sound processing unit.

2. The microphone package structure of claim 1, wherein the substrate and the upper cap are both rectangles as viewing from their tops.

3. The microphone package structure of claim 1, wherein the substrate and the upper cap are both non-rectangles as viewing from their tops.

4. The microphone package structure of claim 1, wherein the first connective areas of the substrate and the second connective areas of the upper cap are inclined planes.

5. The microphone package structure of claim 2, wherein the first connective areas of the substrate and the second connective areas of the upper cap are inclined planes.

6. The microphone package structure of claim 3, wherein the first connective areas of the substrate and the second connective areas of the upper cap are inclined planes.

7. The microphone package structure of claim 1, wherein the first connective areas of the substrate are stepped planes.

8. The microphone package structure of claim 2, wherein the first connective areas of the substrate are stepped planes.

9. The microphone package structure of claim 3, wherein the first connective areas of the substrate are stepped planes.

10. The microphone package structure of claim 1, wherein the first connective areas of the substrate are stepped inclined planes, and the second connective areas of the upper cap are inclined planes.

11. The microphone package structure of claim 2, wherein the first connective areas of the substrate are stepped inclined planes, and the second connective areas of the upper cap are inclined planes.

12. The microphone package structure of claim 3, wherein the first connective areas of the substrate are stepped inclined planes, and the second connective areas of the upper cap are inclined planes.

13. The microphone package structure of claim 1, wherein there is a protrusion between the pair of the first connective areas to separate the first connective areas from each other.

14. The microphone package structure of claim 13, wherein the protrusion is a rectangle.

* * * * *